United States Patent
Weber et al.

(10) Patent No.: US 11,418,885 B2
(45) Date of Patent: Aug. 16, 2022

(54) MICROMECHANICAL COMPONENT FOR A SENSOR DEVICE OR MICROPHONE DEVICE

(71) Applicant: Robert Bosch GmbH, Stuttgart (DE)

(72) Inventors: Heribert Weber, Nuertingen (DE); Andreas Scheurle, Leonberg (DE); Christoph Hermes, Kirchentellinsfurt (DE); Peter Schmollngruber, Aidlingen (DE); Thomas Friedrich, Moessingen-Oeschingen (DE)

(73) Assignee: Robert Bosch GmbH, Stuttgart (DE)

( * ) Notice: Subject to any disclaimer, the term of this patent is extended or adjusted under 35 U.S.C. 154(b) by 58 days.

(21) Appl. No.: 17/147,310

(22) Filed: Jan. 12, 2021

(65) Prior Publication Data
US 2021/0219058 A1 Jul. 15, 2021

(30) Foreign Application Priority Data
Jan. 14, 2020 (DE) .......................... 102020200333.5

(51) Int. Cl.
*H04R 7/00* (2006.01)
*H04R 7/06* (2006.01)
*H04R 19/04* (2006.01)
*H04R 19/00* (2006.01)

(52) U.S. Cl.
CPC ............. *H04R 7/06* (2013.01); *H04R 19/005* (2013.01); *H04R 19/04* (2013.01); *B81B 2201/0257* (2013.01)

(58) Field of Classification Search
CPC ........ H04R 7/06; H04R 19/005; H04R 19/04; H04R 31/00; B81B 2201/0257; B81B 7/02; B81B 7/0035; B81C 1/00047; B81C 1/00055; B81C 1/00261
See application file for complete search history.

(56) References Cited

U.S. PATENT DOCUMENTS

| | | | |
|---|---|---|---|
| 2002/0006682 A1* | 1/2002 | Benzel | G01L 9/0042 438/50 |
| 2006/0057755 A1* | 3/2006 | Weber | B81C 1/00158 438/48 |
| 2019/0112182 A1* | 4/2019 | Metzger-Brueckl | B81B 7/02 |

* cited by examiner

*Primary Examiner* — Matthew A Eason
(74) *Attorney, Agent, or Firm* — Norton Rose Fulbright US LLP; Gerard Messina

(57) ABSTRACT

A micromechanical component for a sensor device or microphone device. The component includes a diaphragm support structure with a diaphragm, a cavity formed in the diaphragm support structure and adjoined by a diaphragm inner side, and a separating trench structured through the surface of the diaphragm support structure and extends to the cavity and completely frames the diaphragm, and that is sealed off media-tight and/or air-tight using at least one separating trench closure material. An etching channel is formed in the diaphragm support structure, separately from the separating trench, and extends from its first etching channel end section to its second etching channel end section. The first etching channel end section opens into the cavity, and the second etching channel end section is sealed off media-tight and/or air-tight using at least one etching channel closure structure formed on an outer partial surface of the surface of the diaphragm support structure.

10 Claims, 6 Drawing Sheets

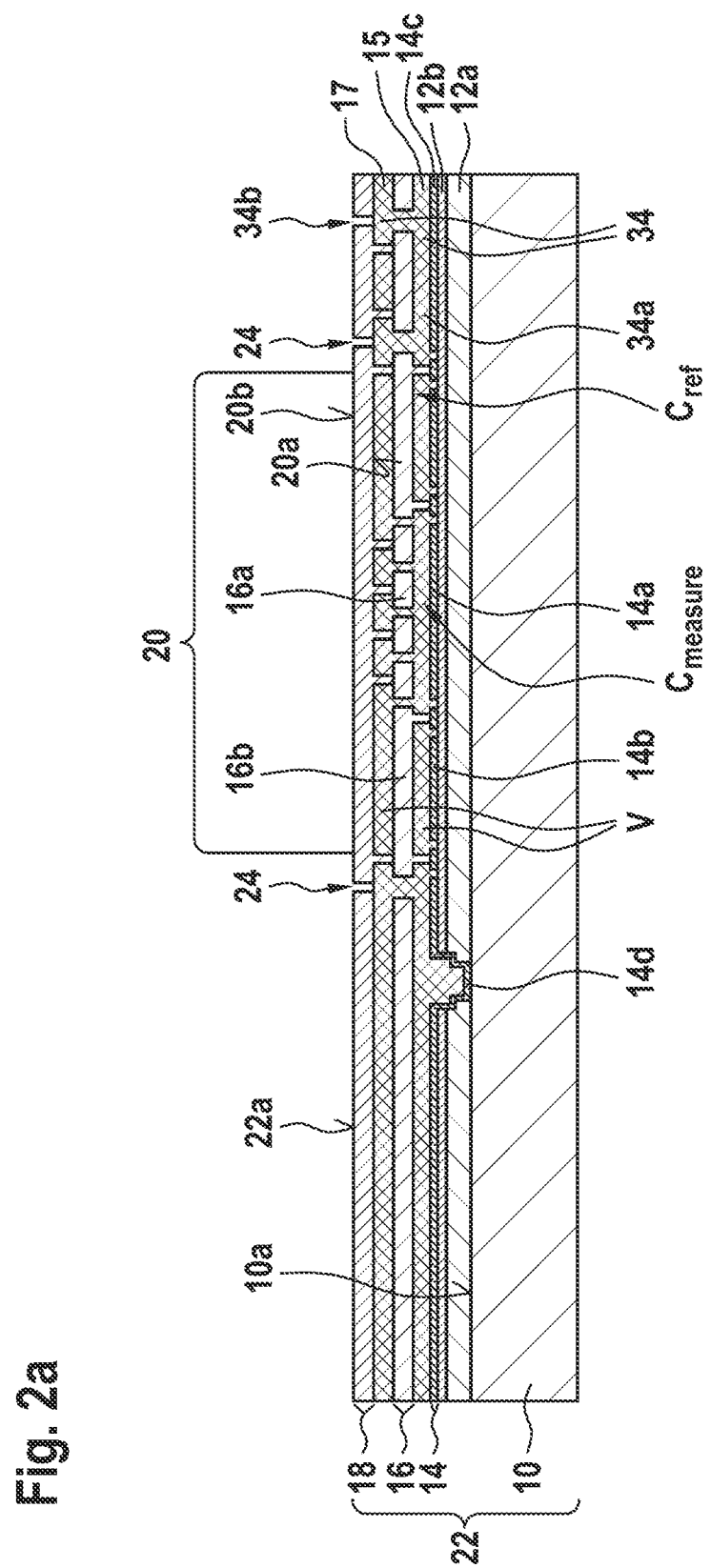

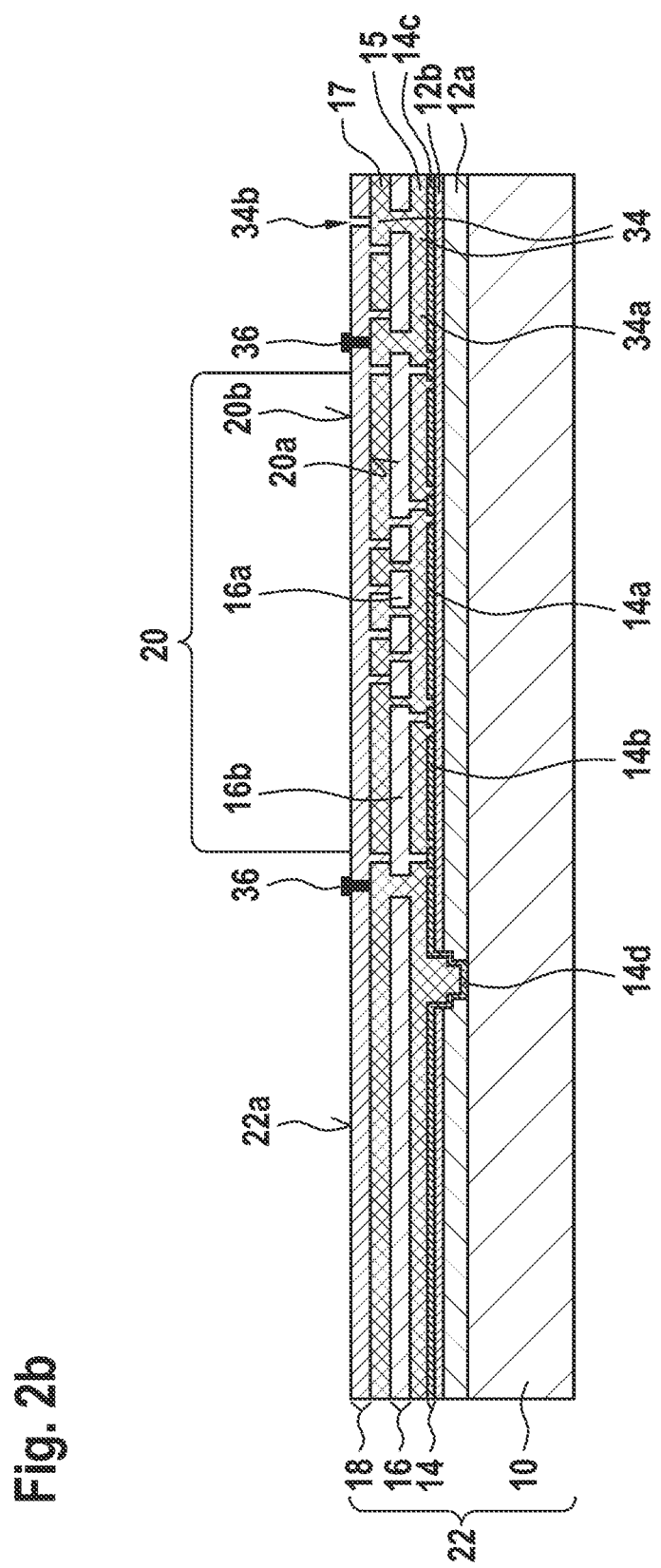

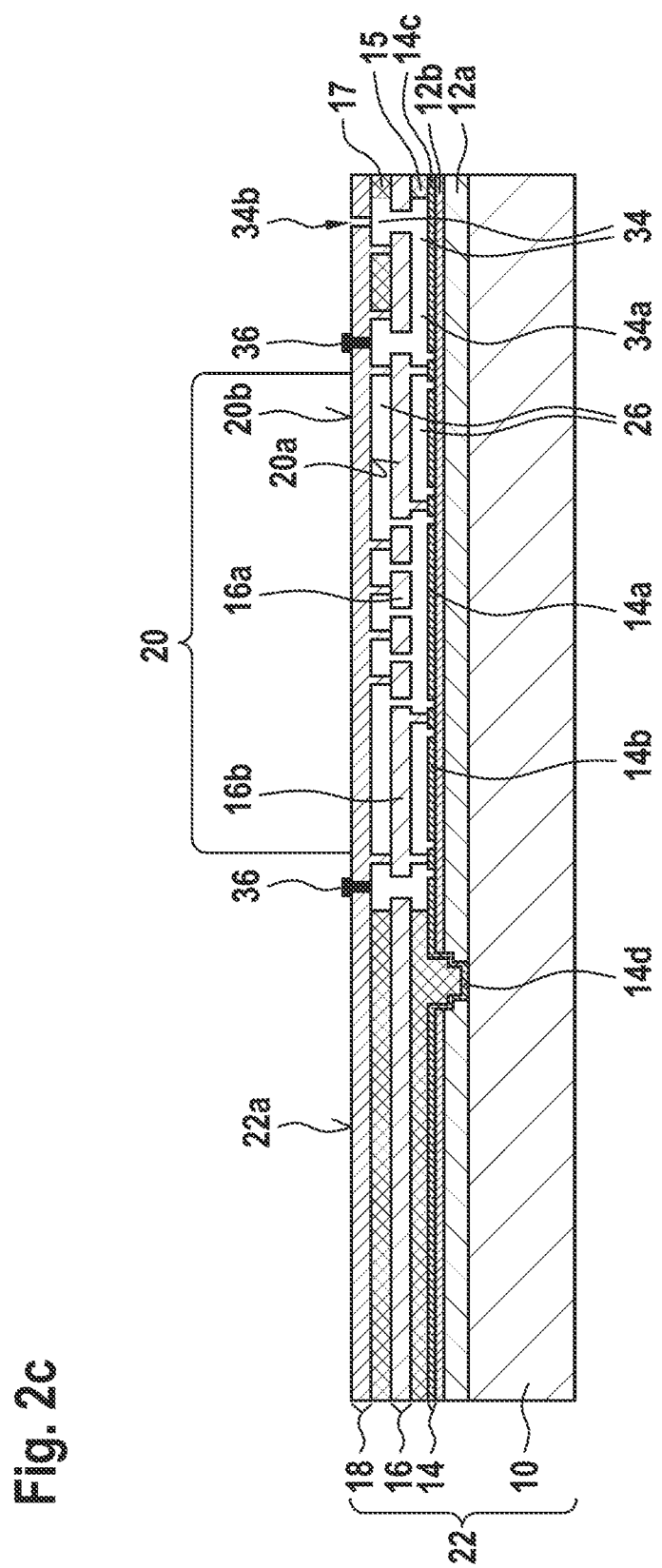

MICROMECHANICAL COMPONENT FOR A SENSOR DEVICE OR MICROPHONE DEVICE

FIELD

The present invention relates to a micromechanical component for a sensor device or microphone device. Moreover, the present invention relates to a method for manufacturing a micromechanical component for a sensor device or microphone device.

BACKGROUND INFORMATION

FIGS. 1a through 1c show schematic cross sections for explaining a method, designed for manufacturing a conventional semiconductor component, according to the related art, which is the present applicant's internal related art.

In the conventional method schematically depicted with the aid of FIGS. 1a through 1c, a layered structure made up of at least one insulating layer 12a and 12b that is deposited on a substrate 10, a wiring layer 14 that at least partially covers the at least one insulating layer 12a and 12b, a first sacrificial layer (not illustrated) that at least partially covers wiring layer 14, a first semiconductor material layer and/or metal layer 16 that at least partially covers the first sacrificial layer, a second sacrificial layer (not illustrated) that at least partially covers first semiconductor material layer and/or metal layer 16, and a second semiconductor material layer and/or metal layer 18 that at least partially covers the second sacrificial layer is initially formed. A diaphragm 20 is formed with the aid of the second semiconductor material layer and/or metal layer, so that the layer stack may also be referred to as a diaphragm support structure 22, with diaphragm 20 that is formed at a surface 22a of diaphragm support structure 22. A separating trench 24 is structured through surface 22a of diaphragm support structure 22 in such a way that separating trench 24 completely frames diaphragm 20 and extends to an inner volume occupied by the first sacrificial layer and the second sacrificial layer. Separating trench 24 may be subsequently used for electrically insulating diaphragm 20. In addition, in the conventional method described here, separating trench 24 is utilized as etching access for etching the first sacrificial layer and the second sacrificial layer. In this way, a cavity 26 is formed in diaphragm support structure 22, a diaphragm inner side 20a of the diaphragm that is directed away from surface 22a of diaphragm support structure 22 adjoining the cavity. The intermediate result is illustrated in FIG. 1a.

For a subsequent use of diaphragm support structure 22 as part of a sensor device or microphone device, separating trench 24 must be closed media-tight and/or air-tight. For this purpose, a closure layer 28 is conventionally formed with the aid of plasma-enhanced chemical vapor deposition (PECVD) or by reactive sputtering (see FIG. 1b). Silicon dioxide, silicon nitride, silicon carbide, and/or aluminum oxide are/is generally deposited as a closure layer 28 with the aid of the plasma-enhanced chemical vapor deposition.

However, closure layer 28 that is formed with the aid of plasma-enhanced chemical vapor deposition or by reactive sputtering often has a non-conforming design in the area of separating trench 24, so that at separating trench 24, so-called peaks 30 may form in closure layer 28 (see FIG. 1c). In addition, the plasma-enhanced chemical vapor deposition or the reactive sputtering process carried out to form closure layer 28 has an effect on a reference pressure that is set in cavity 26.

With regard to further features of the conventional semiconductor component, reference is made to the following description.

SUMMARY

The present invention provides a micromechanical component for a sensor device or microphone device, and a method for manufacturing a micromechanical component for a sensor device or microphone device.

In accordance with an example embodiment of the present invention, micromechanical components are provided, each including a diaphragm and a media-tight and/or air-tight closure layer without so-called peaks in the area of a separating trench that completely frames the diaphragm of the micromechanical component. Thus, in a micromechanical component according to the example embodiment of the present invention there is no concern that a compression load on the diaphragm of the micromechanical component will result in tensile stresses in the area of the at least one peak of the closure layer of the micromechanical component, thus initiating a rupture in the closure layer or a change in a reference pressure that is present in the cavity of the micromechanical component. The micromechanical component according to the present invention or a sensor device or microphone device equipped with same therefore has an extended service life and increased reliability compared to the related art.

A further advantage of the present invention is that the provided manufacturing method may be carried out comparatively easily and with a reasonable labor input. Easily processable and relatively inexpensive materials may be used for carrying out the manufacturing method. A micromechanical component that is provided with the aid of the present invention is therefore manufacturable comparatively cost-effectively despite its increased service life compared to the related art. In addition, miniaturization of the micromechanical component according to the present invention may be carried out relatively easily.

In one advantageous specific example embodiment of the micromechanical component in accordance with the present invention, the at least one etching channel closure structure in each case is an etching channel closure layer that seals off the at least one second etching channel end section of the at least one etching channel media-tight and/or air-tight, and that is made of melted material of at least the outer partial surface of the surface of the diaphragm support structure. The area of the surface of the diaphragm support structure situated outside the diaphragm and outside the separating trench that circumferentially surrounds the diaphragm is referred to as the outer partial surface. Closing the at least one etching channel may thus be easily carried out by melting on at least the material of the outer partial surface with the aid of a laser. Materials such as silicon that may be melted with the aid of a laser are conventionally already used in semiconductor technology. If the melting-on of at least the material of the outer partial surface takes place in a pressure-controlled process chamber, an arbitrary internal cavity pressure may be formed, achieved, or implemented.

Alternatively, the at least one etching channel closure structure may in each case be a eutectic that seals off the at least one second etching channel end section of the at least one etching channel media-tight and/or air-tight, and that is formed at least at the outer partial surface of the surface of the diaphragm support structure. The at least one eutectic that seals off the at least one second etching channel end section media-tight and/or air-tight may also be formed comparatively easily. If the material of at least the outer partial surface of the surface of the diaphragm support structure is silicon, gold may be deposited, for example at the access point of the at least one second etching channel end section, so that the at least one eutectic may be easily formed as an AuSi eutectic by increasing the temperature to at least 360° C. in an oven, for example a rapid thermal annealing (RTA) oven, or with the aid of a laser. If germanium is deposited/provided at the access point of the at least one etching channel end section, by additional deposition of gold or aluminum it is also possible to produce, in addition to a gold-silicon (AuSi) eutectic, a eutectic that contains gold and germanium, or gold, silicon, and germanium, or aluminum and germanium, or aluminum, germanium, silicon, and/or copper. A defined internal cavity pressure may also be optionally enclosed in the cavity by carrying out this process in a pressure-controlled process chamber.

The at least one separating trench closure material is preferably electrically insulating in each case. It is also advantageous when the at least one separating trench closure material has a high etching resistance against hydrogen fluoride in liquid and gaseous form. In this case, hydrogen fluoride may be used as a reliable etching medium to form the cavity by removing silicon dioxide as the at least one sacrificial layer material, also after the media-tight and/or air-tight sealing of the separating trench with the aid of the at least one separating trench closure material.

For example, the at least one separating trench closure material may include silicon-rich nitride. Silicon-rich nitride is media-tight, gas-tight, and electrically insulating, and has a high etching resistance against hydrogen fluoride.

In one advantageous specific example embodiment of the manufacturing method in accordance with the present invention, the at least one second etching channel end section of the at least one etching channel is in each case closed off media-tight and/or air-tight with the aid of an etching channel closure layer, as the at least one etching channel closure structure, by creating the at least one etching channel closure layer with the aid of a laser by melting on material of at least the outer partial surface of the surface of the diaphragm support structure. Such a method step may be carried out comparatively easily, in particular when silicon, silicon dioxide, and/or silicon nitride are/is the material of the outer partial surface of the surface of the diaphragm support structure.

Alternatively, the at least one second etching channel end section of the at least one etching channel may also in each case be closed off media-tight and/or air-tight with the aid of a eutectic, as the at least one etching channel closure structure, which is formed at least at the outer partial surface of the surface of the diaphragm support structure. Such a eutectic is also formable with the aid of method steps that may be carried out comparatively easily.

As a further alternative, the at least one second etching channel end section of the at least one etching channel may in each case be closed off media-tight and/or air-tight with the aid of an etching channel closure layer, as the at least one etching channel closure structure, that is formed by plasma-enhanced chemical vapor deposition, by reactive sputtering, by low pressure chemical vapor deposition (LPCVD), and/or by vapor deposition at least at the outer partial surface of the surface of the diaphragm support structure.

The at least one separating trench closure material is preferably deposited with the aid of low pressure chemical vapor deposition (LPCVD), plasma-enhanced chemical vapor deposition (PECVD), and/or by reactive sputtering in such a way that the separating trench is sealed off media-tight and/or air-tight with the aid of the at least one separating trench closure material. Since the inner volume is still filled with the at least one sacrificial layer material during the low pressure chemical vapor deposition or the reactive sputtering process, the at least one separating trench closure material may be easily deposited in this way without concern for deposition of the at least one separating trench closure material within the subsequently formed cavity, and thus on sensitive structures within the cavity. Thus, in the specific embodiment of the manufacturing method described here, the advantages of the low pressure chemical vapor deposition, the plasma-enhanced chemical vapor deposition, or the reactive sputtering process, such as in particular the formation of a compliant and bubble-free closure from the at least one separating trench closure material, may be utilized without any problems.

BRIEF DESCRIPTION OF THE DRAWINGS

Further features and advantages of the present invention are explained below with reference to the figures.

FIGS. 2a through 2d show schematic cross sections for explaining a first specific example embodiment of the manufacturing method, in accordance with the present invention.

DETAILED DESCRIPTION OF EXAMPLE EMBODIMENTS

Figure 1A:
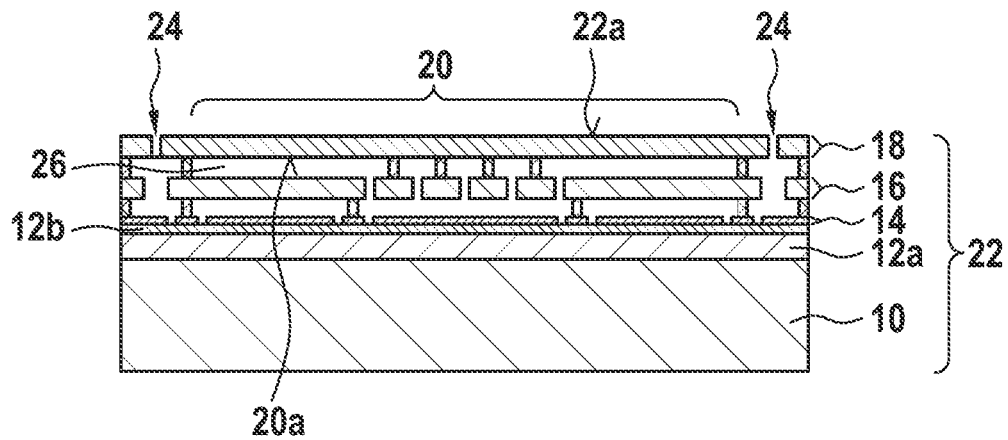
FIGS. 1a through 1c show schematic cross sections for explaining a method that is designed for manufacturing a conventional semiconductor component according to the related art.
Figure 1B:
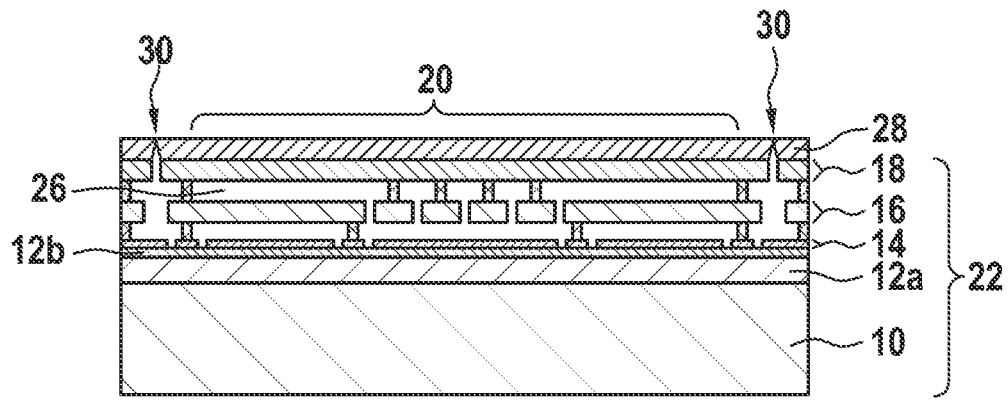
Figure 1C:
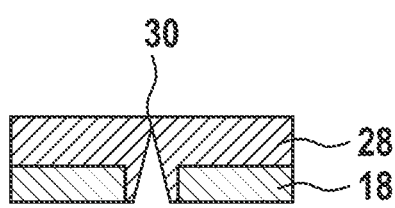

FIGS. 2a through 2d show schematic cross sections for explaining a first specific example embodiment of the manufacturing method in accordance with the present invention.

In the manufacturing method described below, an inner volume V that is filled with at least one sacrificial layer material is formed in a diaphragm support structure 22. In addition, a diaphragm 20 at a surface 22a of diaphragm support structure 22, with a diaphragm inner side 20a directed away from surface 22a of diaphragm support structure 22, and with a diaphragm outer side 20b situated on surface 22a of diaphragm support structure 22, is designed in such a way that diaphragm inner side 20a adjoins inner volume V which is filled with the at least one sacrificial layer material.

As an example, this takes place with the aid of the manufacturing method schematically depicted in FIGS. 2a through 2d, in that at least one insulating layer 12a and 12b is initially deposited and/or formed on a substrate surface 10a of a substrate 10 in such a way that substrate surface 10a is at least partially covered with the aid of the at least one insulating layer 12a and 12b. Substrate 10 is preferably a silicon substrate or a silicon wafer. In particular, a silicon dioxide layer 12a and a silicon-rich nitride layer 12b may be formed as the at least one insulating layer 12a and 12b. The at least one insulating layer 12a and 12b is subsequently at least partially covered with a wiring layer 14. Wiring layer 14 may, for example, be/include a metal layer, in particular a metal silicide layer and/or a metal alloy layer, and/or a doped silicon layer/polysilicon layer. For example, at least one measuring counter electrode 14a, at least one reference counter electrode 14b, at least one strip conductor 14c, and at least one substrate contact 14d that extends through the at least one insulating layer 12a and 12b up to substrate 10 may be formed/structured from wiring layer 14a.

A first sacrificial layer 15 made of at least one sacrificial layer material is subsequently deposited, the first sacrificial layer at least partially covering wiring layer 14 or structures 14a through 14d that are formed/structured from wiring layer 14. First sacrificial layer 15 is preferably made of silicon dioxide. A first semiconductor layer and/or metal layer 16 that at least partially cover(s) first sacrificial layer 15 are/is then deposited. First semiconductor layer and/or metal layer 16 may include at least one metal, for example at least one metal silicide layer and/or at least one metal alloy, and/or doped silicon/polysilicon. For example, first semiconductor material layer and/or metal layer 16 are/is a doped silicon layer/polysilicon layer. At least one (subsequent) movable measuring electrode 16a, at least one firmly fixed reference electrode 16b, and/or portions 16c of subsequent support structures may be formed/structured from first semiconductor material layer and/or metal layer 16.

First semiconductor material layer and/or metal layer 16 are/is subsequently at least partially covered with a second sacrificial layer 17 made of at least one sacrificial layer material. Second sacrificial layer 17 may also be a silicon dioxide layer. A second semiconductor material layer and/or metal layer 18 that at least partially cover(s) a second sacrificial layer 17, of which partial areas may be utilized as diaphragm 20, are/is subsequently formed. Second semiconductor material layer and/or metal layer 18 may also include at least one metal, for example at least one metal silicide layer and/or at least one metal alloy, and/or doped silicon/polysilicon. For example, second semiconductor material layer and/or metal layer 18 are/is a doped silicon layer/polysilicon layer.

As is apparent in FIG. 2a, diaphragm support structure 22 that is formed in this way has a partial volume which is occupied by areas of first sacrificial layer 15 and of second sacrificial layer 17, and which may be referred to as inner volume V that is filled with the at least one sacrificial layer material. However, the above-described method steps for forming diaphragm support structure 22 are to be interpreted only by way of example. Likewise, the design of diaphragm support structure 22, with a measuring capacitor $C_{measure}$ that includes the at least one measuring counter electrode 14a and the at least one measuring electrode 16a, and with a reference capacitor $C_{ref}$ that includes the at least one reference counter electrode 14b and the at least one reference electrode 16b, is to be understood only as an example.

A separating trench 24 is subsequently structured through surface 22a of diaphragm support structure 22 in such a way that separating trench 24 extends to inner volume V that is filled with the at least one sacrificial layer material, and completely frames diaphragm 20. Separating trench 24 is at least partially framed by an outer partial surface of surface 22a of diaphragm support structure 22. Separating trench 24 may in particular have a shape or cross section in the form of a V. The advantage of such a design of the separating trench is discussed in greater detail below.

As is also apparent in FIG. 2a, during the formation of the layered structure utilized as subsequent diaphragm support structure 22, at least one etching channel 34 is also at least partially formed in diaphragm support structure 22 in such a way that the at least one (subsequent) etching channel 34 extends through diaphragm support structure 22, separately from separating trench 24. The at least one etching channel 34 is designed in such a way that at least one first etching channel end section 34a of the at least one etching channel 34 opens at inner volume V that is filled with the at least one sacrificial layer material. In addition, the at least one etching channel 34 is also designed in such a way that at least one second etching channel end section 34b of the at least one etching channel 34 passes through the outer partial surface of surface 22a of diaphragm support structure 22, and the at least one etching channel 34 extends in each case from its first etching channel end section 34a to its second etching channel end section 34b. The at least one second etching channel end section 34b may optionally also have a shape or cross section in the form of a V. The at least one second etching channel end section 34b together with separating trench 24 may, for example, be structured through second semiconductor material layer and/or metal layer 18 with the aid of an etching process. Alternatively, the at least one second etching channel end section 34b may also be produced at another point in time as a separating trench 24, in particular also after a closure of separating trench 24 described below. The at least one etching channel 34 may also be referred to in each case as an etched trench or etching access. The intermediate result is illustrated in FIG. 2a.

As illustrated in FIG. 2b, separating trench 24 is sealed off media-tight and/or air-tight with the aid of at least one separating trench closure material 36. The at least one separating trench closure material is preferably electrically insulating in each case. In this case, separating trench 24, which is sealed off media-tight/air-tight via the at least one separating trench closure material 36, allows a reliable electrical insulation of diaphragm 20. A shape or a cross section in the form of a V may ensure that no peaks 30 or breaks/bubbles occur in the at least one separating trench closure material 36.

The at least one separating trench closure material 36 also preferably has a high etching resistance against at least one etching medium, so that the particular etching medium may be used without damage to the media-tight/air-tight seal of separating trench 24, also after the media-tight/air-tight sealing of separating trench 24. The at least one separating trench closure material 36 advantageously has a high etching resistance against hydrogen fluoride in liquid and gaseous form. For example, silicon-rich nitride may be used as the at least one separating trench closure material 36, in particular as a single separating trench closure material 36.

Since inner volume V is still filled with the at least one sacrificial layer material during the media-tight/air-tight closing of separating trench 24 with the aid of the at least one separating trench closure material 36, the at least one separating trench closure material 36 may be deposited with the aid of a compliant deposition process, for example low pressure chemical vapor deposition (LPCVD), without concern for undesirable introduction of the at least one separating trench closure material 36 into inner volume V, or for peaks 30 or breaks/bubbles in the at least one separating trench closure material 36. The at least one sacrificial layer material in inner volume V thus acts as a "storage surface" within separating trench 24 during the deposition of the at least one separating trench closure material 36. Separating trench 24 may therefore be closed air-tight in a conforming manner via the at least one separating trench closure material 36 with the aid of low pressure chemical vapor deposition, for example.

After the deposition of the at least one separating trench closure material 36, deposited separating trench closure material 36 may optionally be structured in such a way that it is present (essentially) only in the area of separating trench 24. Coating of diaphragm 20 with the at least one separating trench closure material 36 may thus be avoided/eliminated, so that it is not necessary to accept undesirable stress input from the at least one separating trench closure material 36 onto diaphragm 20.

FIG. 2c shows a removal of the at least one sacrificial layer material at least from inner volume V, carried out after the air-tight sealing of separating trench 24, with the aid of an etching medium that is led through the at least one etching channel 34. A cavity 26 is thus formed by removing the at least one sacrificial layer material from inner volume V. It is expressly pointed out that separating trench 24 is present with a media-tight/air-tight closure during the etching of the at least one etching material with the aid of the etching medium, and therefore the etching medium is led solely through the at least one etching channel 34, which is formed in diaphragm support structure 22 separately from separating trench 24. The at least one separating trench closure material 36 preferably has a high etching resistance against the etching medium used. If inner volume V is filled with silicon dioxide as the at least one sacrificial layer material, for example hydrogen fluoride in liquid or gaseous form may advantageously be used as etching medium.

If the at least one etching channel 34 is likewise at least partially filled with the at least one sacrificial layer material before the at least one sacrificial layer material is removed from inner volume V, the at least one sacrificial layer material present in the at least one etching channel 34 may likewise be removed with the aid of the etching medium that is led through the at least one etching channel 34. The at least one etching channel 34 may optionally also be laterally delimited by etch stop structures made of at least one material that is etch-resistant for the etching medium, as the result of which precise geometric dimensions and a defined location/position of the at least one etching channel 34 are achievable.

Figure 2D:
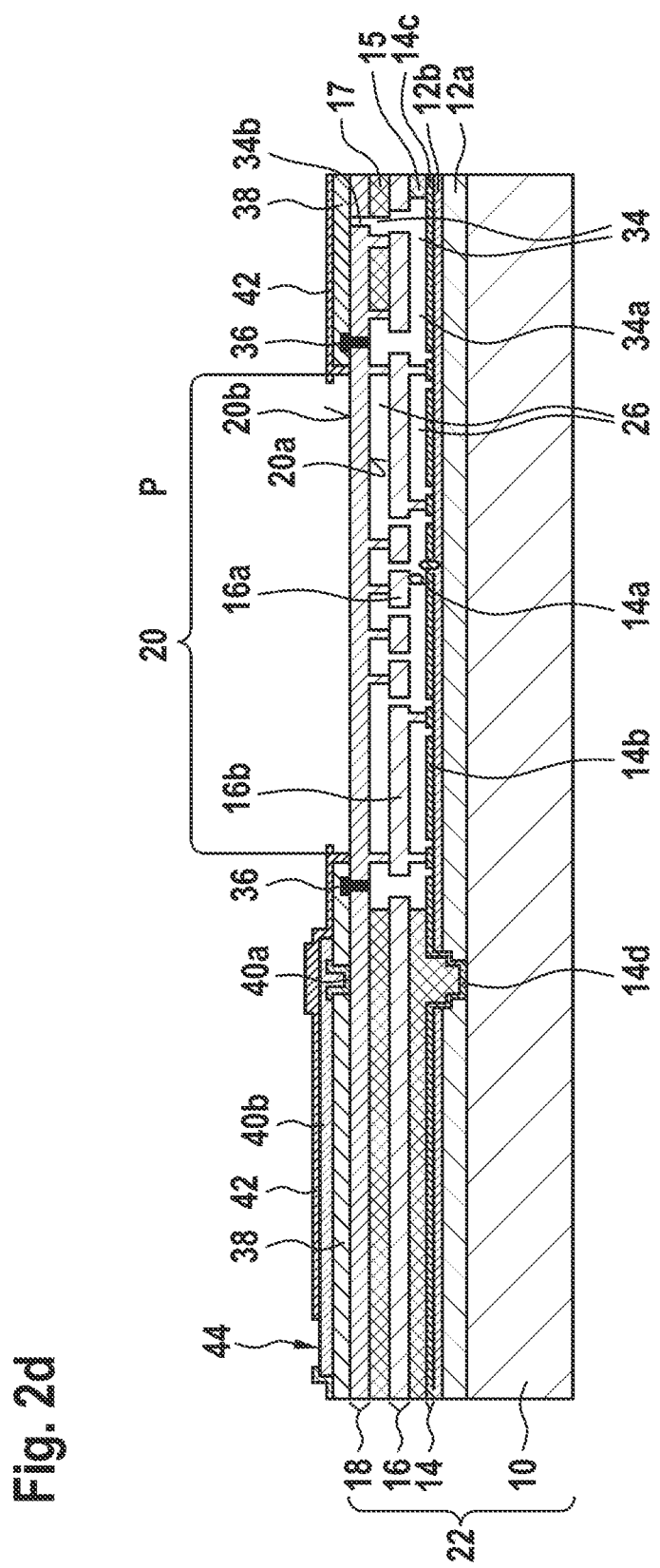

The manufacturing method described here ends with a media-tight/air-tight sealing of the at least one second etching channel end section 34b of the at least one etching channel 34, schematically illustrated in FIG. 2d, in each case with the aid of at least one etching channel closure structure 38 that is formed in the area of the opening of the at least one second etching channel end section 34b through the outer partial surface of surface 22a of diaphragm support structure 22. Since the at least one second etching channel end section 34b is comparatively far from cavity 26, numerous methods for air-tight sealing of the at least one second etching channel end section 34b may be used, which would have little or no suitability for a media-tight/air-tight sealing of separating trench 24. For the media-tight/air-tight sealing of the at least one second etching channel end section 34b of the at least one etching channel 34, methods may thus also be used with the aid of which a comparatively low reference pressure $p_0$ may be enclosed in cavity 26. Diaphragm 20 may thus also be utilized for determining/measuring a comparatively low pressure P on its diaphragm outer side 20b and/or for detecting sound waves having relatively low intensity, in particular also for implementing a slight temperature dependency of the measuring signal.

In the example of FIG. 2d, the at least one second etching channel end section 34b of the at least one etching channel 34 is in each case sealed off media-tight/air-tight with the aid of an etching channel closure structure 38, as the at least one etching channel closure structure 38, that is formed, for example, by plasma-enhanced chemical vapor deposition (PECVD), by reactive sputtering, by low pressure chemical vapor deposition (LPCVD), and/or by deposition at the outer partial surface of surface 22a of diaphragm support structure 22. In contrast to separating trench closure material 36, the material for sealing the at least one second etching channel end section 34b of the at least one etching channel may also be selected to be electrically conductive. Since a particular opening of the at least one second etching channel end section 34a at the outer partial surface of surface 22a of diaphragm support structure 22 is comparatively small (in particular in comparison to an opening of separating trench 24 at surface 22a of diaphragm support structure 22), under a normal compression load on diaphragm 20 the stress coupled into the at least one etching channel closure structure 38 due to compression load is negligible compared to the stress that is coupled into separating trench closure material 36 that frames diaphragm 20 and closes separating trench 24, so that, even if peaks form in the at least one etching channel closure structure 38, no rupture in etching channel closure structure 38 or change in a reference pressure present in cavity 26 is initiated, and therefore no failure of the component is to be expected. After the media-tight/air-tight sealing of the at least one second etching channel end section 34b, at least one insulating layer (not illustrated), at least one contact/one diffusion barrier 40a, at least one strip conductor 40b, at least one insulating layer/passivation layer 42, and/or at least one bond pad opening (optional only outside diaphragm 20) may also be formed/provided on etching channel closure structure 38 that is formed with the aid of the plasma-enhanced chemical vapor deposition, by reactive sputtering, and/or by vapor deposition.

Figure 3:
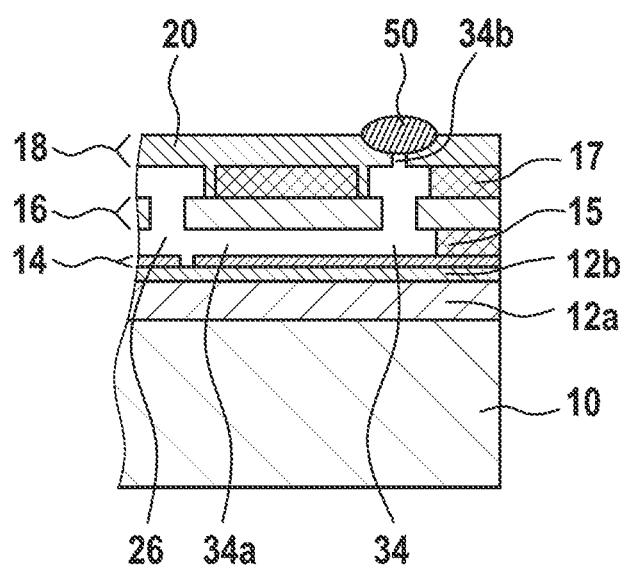
FIG. 3 shows a schematic cross section for explaining a second specific example embodiment of the manufacturing method, in accordance with the present invention.

FIG. 3 shows a schematic cross section for explaining a second specific example embodiment of the manufacturing method in accordance with the present invention.

The manufacturing method schematically depicted in FIG. 3 differs from the specific embodiment described above, solely in that the at least one second etching channel end section 34b of the at least one etching channel 34 is in each case sealed off media-tight/air-tight with the aid of a eutectic 50, as the at least one etching channel closure structure 38, that is formed in the area of the opening of the at least one second etching channel end section 34b through the outer partial surface of surface 22a of diaphragm support structure 22. If the material of the outer partial surface of surface 22a of diaphragm support structure 22 in the area of the opening of the at least one second etching channel end section 34b is at least partially silicon or germanium, for example gold may also be deposited at the at least one second etching channel end section 34b, so that the at least one eutectic 50 may be easily formed as an AuSi eutectic, an AuGe eutectic, or as a eutectic containing gold, silicon, and germanium, by increasing the temperature to at least 360° C. In addition, as an alternative to gold, a layer made of aluminum, aluminum/silicon, or aluminum/silicon/copper, as is conventional in standard semiconductor processes, for example, may be deposited at the at least one second etching channel end section 34b, so that the at least one eutectic 50 made up of aluminum and/or germanium and/or silicon and/or copper may be easily formed by increasing the temperature to at least 420° C. Sealing the at least one second etching channel end section 34b, in each case with the aid of a eutectic 50, allows enclosure of a comparatively low reference pressure $p_0$ in cavity 26.

With regard to further features and advantages of the manufacturing method of FIG. 3, reference is made to the specific embodiment described above.

Alternatively, the at least one second etching channel end section 34b of the at least one etching channel 34 may also be sealed off media-tight/air-tight in each case with the aid of an etching channel closure layer as the at least one etching channel closure structure 38, in that the at least one etching channel closure layer is created with the aid of a laser by melting on material in the area of the opening of the at least one second etching channel end section 34b through the outer partial surface of surface 22a of diaphragm support structure 22. Sealing the at least one second etching channel end section 34b, in each case with the aid of an etching channel closure layer, also allows enclosure of a comparatively low reference pressure $p_0$ in cavity 26.

FIGS. 2d and 3 also show specific embodiments of a micromechanical component according to the present invention for a sensor device or microphone device. Such a micromechanical component according to the present invention includes a diaphragm support structure 22 with a diaphragm 20 that is formed at a surface 22a of diaphragm support structure 22 and that includes a diaphragm inner side 20a, directed away from surface 22a of diaphragm support structure 22, and a diaphragm outer side 20b situated on surface 22a of diaphragm support structure 22, a cavity 26, formed in diaphragm support structure 22, that is adjoined by diaphragm inner side 20a, and a separating trench 24 which is structured through surface 22a of diaphragm support structure 22 and which extends to cavity 26 and completely frames diaphragm 20, and which is at least partially framed by an outer partial surface of the surface of the diaphragm support structure, and which is sealed off media-tight/air-tight with the aid of at least one separating trench closure material 36. In addition, the micromechanical component according to the present invention includes at least one etching channel 34 which is formed in diaphragm support structure 22 separately from separating trench 24, and which extends in each case from its first etching channel end section 34a to its second etching channel end section 34b, the at least one first etching channel end section 34a of the at least one etching channel 34 opening into cavity 26, and the at least one second etching channel end section 34b of the at least one etching channel 34 being sealed off media-tight and/or air-tight in each case with the aid of at least one etching channel closure structure 38 or 50 that is formed in the area of the opening of the at least one second etching channel end section 34b through the outer partial surface of surface 22a of diaphragm support structure 22.

With regard to further features and advantages of the micromechanical components of FIGS. 2d and 3, reference is made to the manufacturing methods described above.

What is claimed is:

1. A micromechanical component for a sensor device or microphone device, comprising:
    a diaphragm support structure with a diaphragm formed at a surface of the diaphragm support structure and includes a diaphragm inner side directed away from the surface of the diaphragm support structure;
    a cavity formed in the diaphragm support structure and adjoined by the diaphragm inner side;
    a separating trench that is structured through the surface of the diaphragm support structure and that extends to the cavity and completely frames the diaphragm, and that is at least partially framed by an outer partial surface of the surface of the diaphragm support structure, and that is sealed off media-tight and/or air-tight using at least one separating trench closure material; and
    at least one etching channel that is formed in the diaphragm support structure separately from the separating trench, and that each extends from a first etching channel end section of the etching channel to a second etching channel end section of the etching channel, the at least one first etching channel end section opening into the cavity, and the at least one second etching channel end section in each case being sealed off media-tight and/or air-tight using at least one etching channel closure structure that is formed at least at the outer partial surface of the surface of the diaphragm support structure.

2. The micromechanical component as recited in claim 1, wherein each of the at least one etching channel closure structure is an etching channel closure layer that seals off the at least one second etching channel end section of the at least one etching channel media-tight and/or air-tight, and that is made of melted-on material of at least the outer partial surface of the surface of the diaphragm support structure.

3. The micromechanical component as recited in claim 1, wherein each of the at least one etching channel closure structure is a eutectic that seals off the at least one second etching channel end section of the at least one etching channel media-tight and/or air-tight, and that is formed at least at the outer partial surface of the surface of the diaphragm support structure.

4. The micromechanical component as recited in claim 1, wherein the at least one separating trench closure material is electrically insulating in each case, and has a high etching resistance against hydrogen fluoride in liquid and gaseous form.

5. The micromechanical component as recited in claim 4, wherein the at least one separating trench closure material includes silicon-rich nitride.

6. A manufacturing method for a micromechanical component for a sensor device or microphone device, the method comprising the following steps:
    forming, in a diaphragm support structure, an inner volume, which is filled with at least one sacrificial layer material;
    forming a diaphragm at a surface of the diaphragm support structure with a diaphragm inner side, directed away from the surface of the diaphragm support structure, in such a way that the diaphragm inner side adjoins the inner volume which is filled with the at least one sacrificial layer material;
    structuring a separating trench through the surface of the diaphragm support structure, the separating trench extending to the inner volume filled with the at least one sacrificial layer material and completely framing the diaphragm, and being at least partially framed by an outer partial surface of the surface of the diaphragm support structure;
    forming at least one etching channel in the diaphragm support structure, which each extends, separately from the separating trench, from a first etching channel end section of the etching channel to the second etching channel end section of the etching channel in such a way that the at least one first etching channel end section opens at the inner volume that is filled with the at least one sacrificial layer material, and the at least one second etching channel end section passes through the outer partial surface of the surface of the diaphragm support structure;
    sealing the separating trench media-tight and/or air-tight using at least one separating trench closure material;
    removing the at least one sacrificial layer material at least from the inner volume using an etching medium that is led through the at least one etching channel, after the media-tight and/or air-tight sealing of the separating trench; and
    sealing the at least one second etching channel end section of the at least one etching channel media-tight and/or air-tight in each case using at least one etching channel closure structure that is formed at least at the outer partial surface of the surface of the diaphragm support structure.

7. The manufacturing method as recited in claim 6, wherein the at least one second etching channel end section of the at least one etching channel is sealed off media-tight and/or air-tight in each case using an etching channel closure layer, as the at least one etching channel closure structure, by creating the at least one etching channel closure layer using a laser by melting on material of at least the outer partial surface of the surface of the diaphragm support structure.

8. The manufacturing method as recited in claim 6, wherein the at least one second etching channel end section of the at least one etching channel is sealed off media-tight and/or air-tight in each case using a eutectic, as the at least one etching channel closure structure, which is formed at least at the outer partial surface of the surface of the diaphragm support structure.

9. The manufacturing method as recited in claim 6, wherein the at least one second etching channel end section of the at least one etching channel is sealed off media-tight and/or air-tight in each case using an etching channel closure layer, as the at least one etching channel closure structure, which is formed by plasma-enhanced chemical vapor deposition, and/or by reactive sputtering, and/or by low pressure chemical vapor deposition, and/or by vapor deposition, at least at the outer partial surface of the surface of the diaphragm support structure.

10. The manufacturing method as recited in claim 6, wherein the at least one separating trench closure material is deposited using low pressure chemical vapor deposition, an/or using plasma-enhanced chemical vapor deposition, and/or by reactive sputtering, in such a way that the separating trench is sealed off media-tight and/or air-tight using the at least one separating trench closure material.

* * * * *